United States Patent
Sathu et al.

(10) Patent No.: US 10,839,875 B2
(45) Date of Patent: Nov. 17, 2020

(54) TIMER FOR USE DUAL VOLTAGE SUPPLIES

(71) Applicant: Advanced Micro Devices, Inc., Santa Clara, CA (US)

(72) Inventors: Srinivas R. Sathu, Austin, TX (US); John Wuu, Fort Collins, CO (US); Russell Schreiber, Austin, TX (US); Martin Piorkowski, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/370,579

(22) Filed: Mar. 29, 2019

(65) Prior Publication Data

US 2020/0312389 A1    Oct. 1, 2020

(51) Int. Cl.
*G11C 7/22* (2006.01)
*G11C 11/419* (2006.01)

(52) U.S. Cl.
CPC .............. *G11C 7/22* (2013.01); *G11C 11/419* (2013.01)

(58) Field of Classification Search
CPC ....... G11C 7/22; G11C 11/419; H03H 11/265; H03K 5/133
See application file for complete search history.

(56) References Cited

U.S. PATENT DOCUMENTS

| | | | |
|---|---|---|---|
| 4,802,129 A | 1/1989 | Hoekstra et al. | |
| 5,546,355 A | 8/1996 | Raatz et al. | |
| 5,781,480 A | 7/1998 | Nogle et al. | |
| 5,973,955 A | 10/1999 | Nogle et al. | |
| 2006/0181324 A1* | 8/2006 | Dreps | H03H 11/265 327/276 |
| 2015/0206578 A1* | 7/2015 | Goel | G11C 11/419 365/154 |
| 2018/0174643 A1* | 6/2018 | Cheng | G11C 5/147 |

* cited by examiner

*Primary Examiner* — David Lam
(74) *Attorney, Agent, or Firm* — Polansky & Associates, P.L.L.C.; Paul J. Polansky; Nathan H. Calvert (57) ABSTRACT

A timing circuit includes an input for receiving the control signal from a logic circuit operating with a first supply voltage and an output for supplying a control signal to a circuit operating with a second supply voltage different from the first supply voltage. The timing circuit also includes a plurality of delay elements connected in series between the input and output and supplied with the first supply voltage, and one or more NFET footer transistors that couple respective delay elements to a negative supply rail, the NFET footer transistors having the second supply voltage applied to their gates. A memory apparatus employing such a circuit is provided.

20 Claims, 7 Drawing Sheets

TIMER FOR USE DUAL VOLTAGE SUPPLIES

BACKGROUND

Many static random-access memory (SRAM) chips use internal timers to track SRAM bitcell operations, deciding when to terminate accesses to the cell for reading and writing. The timer performance is important to the overall memory performance, because timers that are too fast relative to SRAM bitcells can result in functional failures, while timers that are too slow can result in overall slow performance.

Timers are especially important for dual-rail SRAM designs, which use two voltage supplies, with the SRAM bitcells placed on a separate supply (VDDM) while the rest of the logic, including the timer, remains on the main voltage supply (VDD). In dual-rail SRAM designs, when VDD is higher than VDDM, the timer will run faster than the bitcells, which can result in functional failures.

A common solution for such failures is to simply add more margin to the VDD timer delay. However, this solution results in unnecessarily large margins and poor performance when VDD is lower, reducing the memory operating frequency. The reduction can be partially mitigated by selecting different timer delays for different VDD values, but such a solution adds significant complexity to system design and testing, and is typically limited to coarse voltage granularity.

Another solution would involve supplying the timer with VDDM and using a level shifter on the timer input. However, for high speed designs, level shifter delays can be longer than the actual timer delays, which limits usefulness of such a solution.

Yet another option is to use a purely edge-based design in which no timers are needed. However, the scheme is not feasible for double-pumped memory designs that are common in modern products, and requires more stringent clock specifications.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

A memory apparatus is provided including a control logic circuit generating timing signals and a plurality of bit cells in an array receiving the timing signals. The control logic supplied with a first supply voltage, and the bit cells supplied with a second supply voltage different from the first supply voltage. A timer circuit carries the timing signals to the bit cells. The timer circuit includes a plurality of delay elements coupled together in series and supplied with the first supply voltage and each having an NFET (n-channel field effect transistor) footer transistor coupling the delay element to a negative supply rail, the NFET footer transistors having a first gate voltage based on the second supply voltage applied to their gates.

A CMOS timing circuit is provided including an input for receiving the control signal from a logic circuit operating with a first supply voltage and an output for supplying a control signal to a circuit operating with a second supply voltage different from the first supply voltage. A plurality of delay elements are connected in series between the input and output and supplied with the first supply voltage. One or more NFET footer transistors connect respective delay elements to a negative supply rail, the NFET footer transistors having a first gate voltage based on the second supply voltage applied to their gates.

A method is provided for delaying signals in a CMOS circuit including a first voltage domain having a first supply voltage and a second voltage domain having a second supply voltage. The method includes receiving a signal from a logic circuit operating with the first supply voltage. The signal is passed through a plurality of delay elements each supplied with the first supply voltage. A first gate voltage based on the second supply voltage is applied to gates of NFET footer transistors of the delay elements, thereby controlling the speed of respective delay elements by varying current allowed through the NFET footer transistors as the second voltage supply varies. The signal is passed to a circuit in the second voltage domain.

Figure 1:
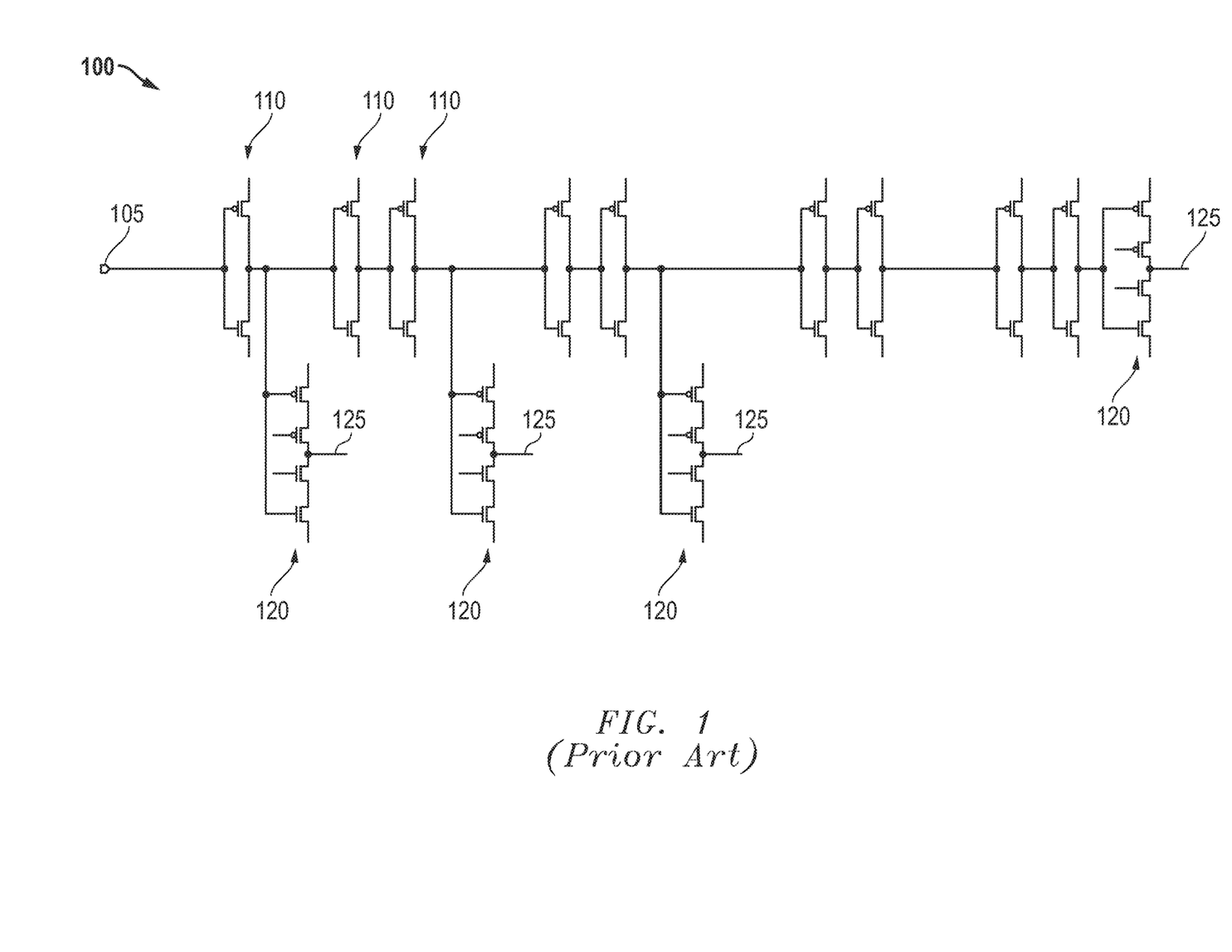
FIG. 1 illustrates in circuit diagram form a timer circuit according to an example prior art design.

FIG. 1 illustrates in circuit diagram form a timer circuit 100 according to an example prior art design. Timer circuit 100 is a typical prior art delay circuit with three-state capable outputs. An input terminal 105 receives a logic signal to be delayed. The signal is passed through a number of complementary metal-oxide semiconductor (CMOS) inverters 110, each of which has an activation delay which adds delay to the time it takes for the signal to traverse the circuit.

A number of selectable output branches 120 are connected to selected inverter outputs at different points along timer circuit 100. Each selectable output branch 120 includes an inverter with a three-state selectable output 125. The intermediate transistors in each output branch select the programmable output, which can be floating if unselected, or high or low according to the inverter output if selected. This three-state functionality allows all the three-state selectable outputs 125 to be connected to a common output node for timer circuit 100, with the selected output controlling the state of the common output node. Each selectable output branch provides a different delay time between input terminal 105 and the common output node.

Figure 2:
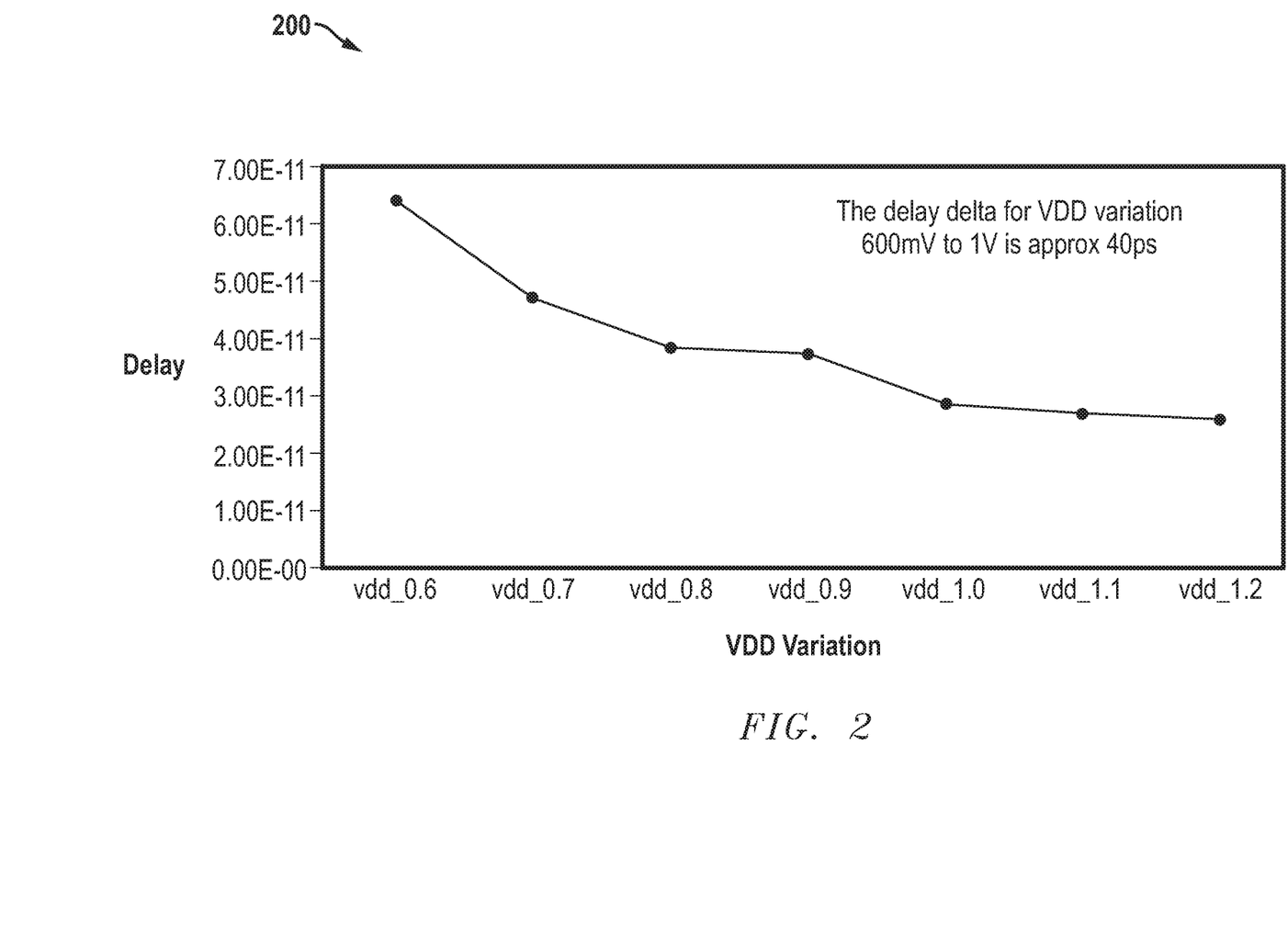
FIG. 2 shows in chart form a delay versus voltage variation performance graph for the timer circuit of FIG. 1.

FIG. 2 shows in chart form a delay versus voltage variation performance graph 200 for the timer circuit of FIG. 1. The timer circuit voltage supply VDD value is shown on the horizontal axis, and the timer circuit delay is shown on the vertical axis. Graph 200 shows a large variation in delay going from about 65 picoseconds at a VDD of 0.6V to about 25 picoseconds at a VDD of 1.2V, a delay delta in this range of approximately 40 picoseconds. For memory designs in which the relevant bitcell timing signals were on the same power domain (VDD) as the timer circuit, and scaled with the same variation, the design of FIG. 1 may work as intended. However, for designs in which the bitcell array is on a separate power domain (VDDM), performance such as that depicted can cause failures. Such failures are especially likely with a large VDDM-VDD difference, which may be a condition required in the relevant specification for functional usage of an SRAM.

Figure 3:
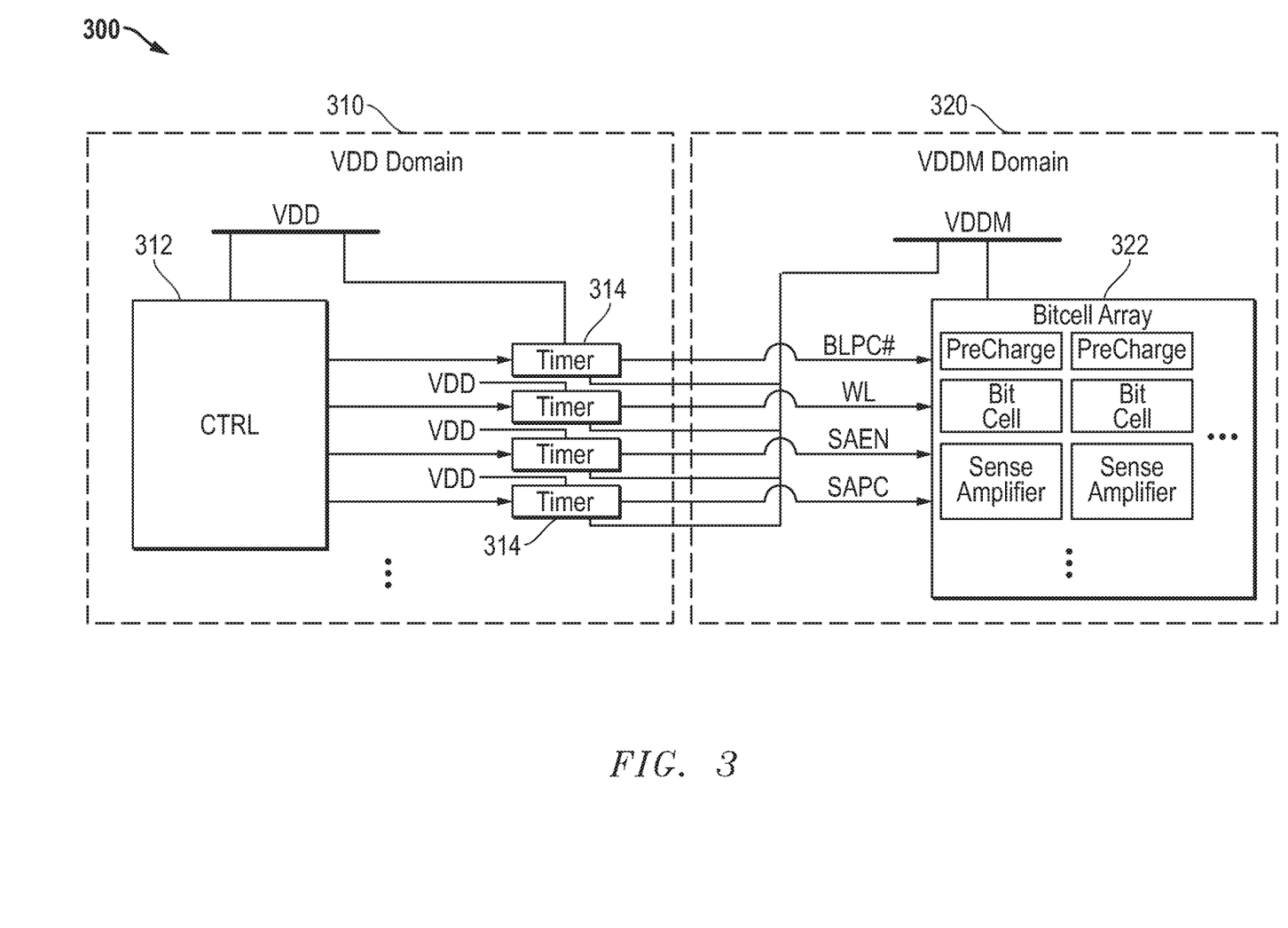
FIG. 3 shows in block diagram form an example dual-rail memory circuit according to some embodiments.

FIG. 3 shows in block diagram form an example dual-rail memory circuit 300 according to some embodiments. Generally depicted are a first voltage domain 310, the VDD domain, in which logic circuitry operates on a first supply voltage VDD, and a second voltage domain 320, the VDDM domain, in which a memory bitcell array 322 operates on a second supply voltage VDDM different from the VDD supply voltage. Generally, the two voltage domains are abstract distinctions based on what supply voltage is employed in the circuitry, and not necessarily different areas on a memory IC. Circuitry from each domain may be intermingled in areas with circuitry from the other domain, although in construction it is best to separate the domains where possible for ease of routing voltage supply lines.

In the VDD domain 310, a control logic circuit 312 generates timing signals for controlling operations of memory bitcell array 322. Control logic circuit 312 is supplied with a first supply voltage, the supply voltage VDD. A number of timer circuits 314 are shown in the VDD domain 310. Each timer circuit 314 receives a designated timing signal from control logic circuit 312 and passes the signal through to the timer circuit output with a designated delay as shown. The delay is preferably selectable or variable. A number of signals are shown passing through timer circuits 314 as an example, including a bitline precharge NOT signal BLPC #, a word line signal WL, a sense amplifier enable signal SAEN, and a sense amplifier precharge signal SAPC. These signals are merely examples and other control and timing signals may be passed through timer circuits 314 including more or few signals, depending on the particular memory design.

As depicted, each timer circuit 314 is supplied with the VDD supply voltage. Each timer circuit 314 also includes a portion that receives the VDDM supply voltage from VDDM domain 320. Preferably, the VDDM supply voltage or a voltage based on the VDDM supply voltage, is fed to some transistor gates as described with respect to the example dual-rail circuitry of FIG. 5 below. Timer circuits 314 operate to vary their delay based on the VDDM supply voltage. This enables timer circuits 314 to exhibit less delay variation as VDD changes for any particular value of VDDM.

After passing through the timer circuits 314, the timing signals are fed to designated target circuits in memory bitcell array 322. Generally, memory bitcell array 322 includes a number of bit cells and related circuitry such as pre-charge circuitry and sense amplifiers, which receive the timing signals through conductive connections.

Figure 4:
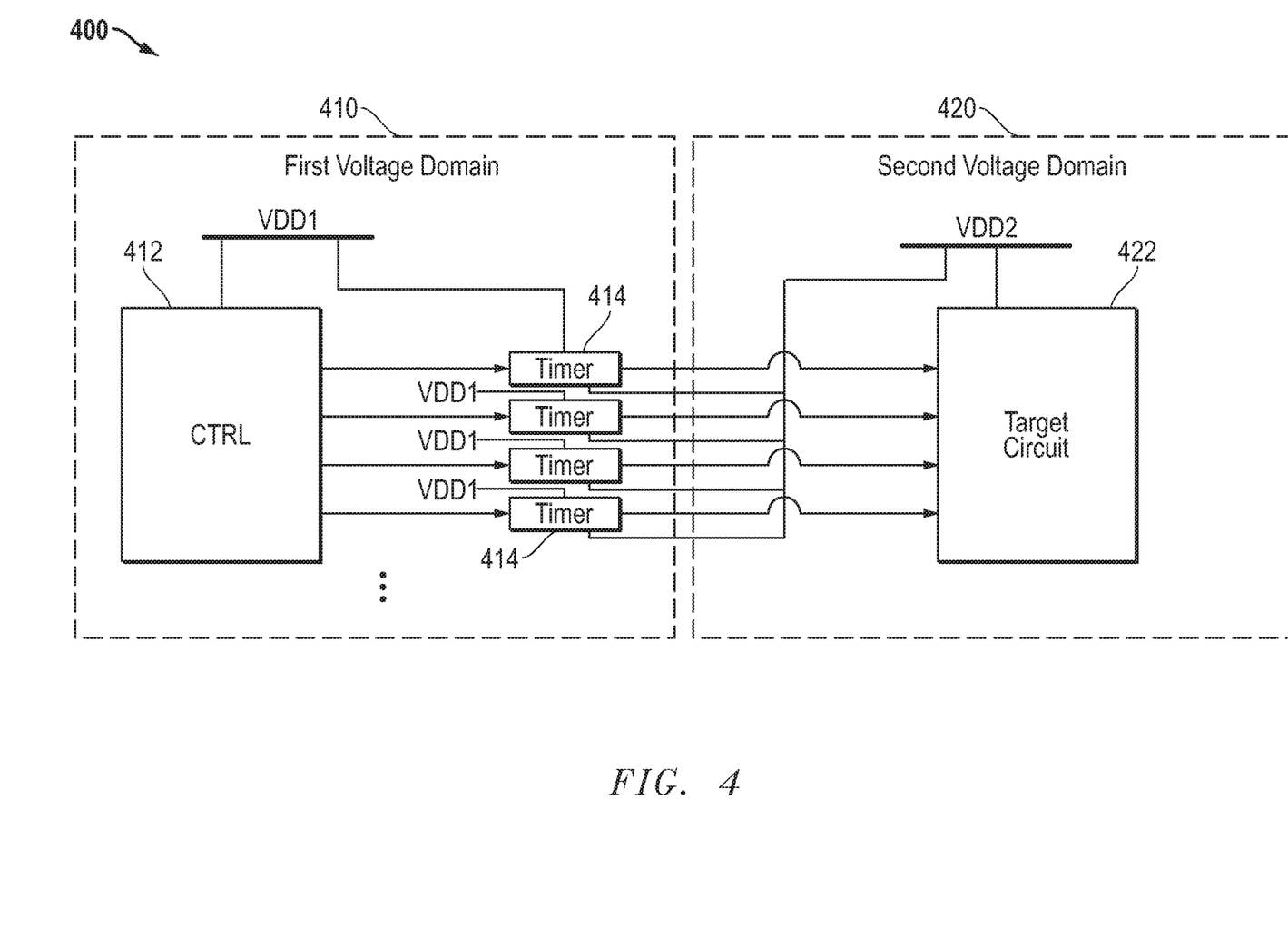
FIG. 4 illustrates in block diagram form an example dual-rail circuit according to some embodiments.

FIG. 4 illustrates in block diagram form an example dual-rail circuit according to some embodiments. In this arrangement, control logic circuit 412 sends control signals to a target circuit which operates on a different supply voltage. Generally depicted are a first voltage domain 410, the VDD1 domain, in which logic circuitry operates on a VDD1 supply voltage, and a second voltage domain 420, the VDD2 domain, in which a target circuit 422 operates on a VDD2 supply voltage different from the VDD1 supply voltage.

In first voltage domain 410, control logic circuit 412 generates control signals for controlling target circuit 422. Timer circuits 414 receive designated control signals form control logic circuit 412 and provide a delay before feeding the signals to the timer circuit outputs which connect to target circuit 422. Timer circuits 414 are supplied by the VDD1 supply voltage. Typically, the output of timer circuits 414 is driven at the VDD1 supply voltage. A portion of the timer circuit receives the VDD2 supply voltage, as shown by the connections from the VDD2 voltage supply to the timer circuits 414. Timer circuits 414 operate to vary their delay based on the VDD2 supply voltage value. The use of the VDD2 supply voltage allows timer circuits 414 to exhibit less delay variation for particular values of VDD2 supply voltage.

Figure 5:
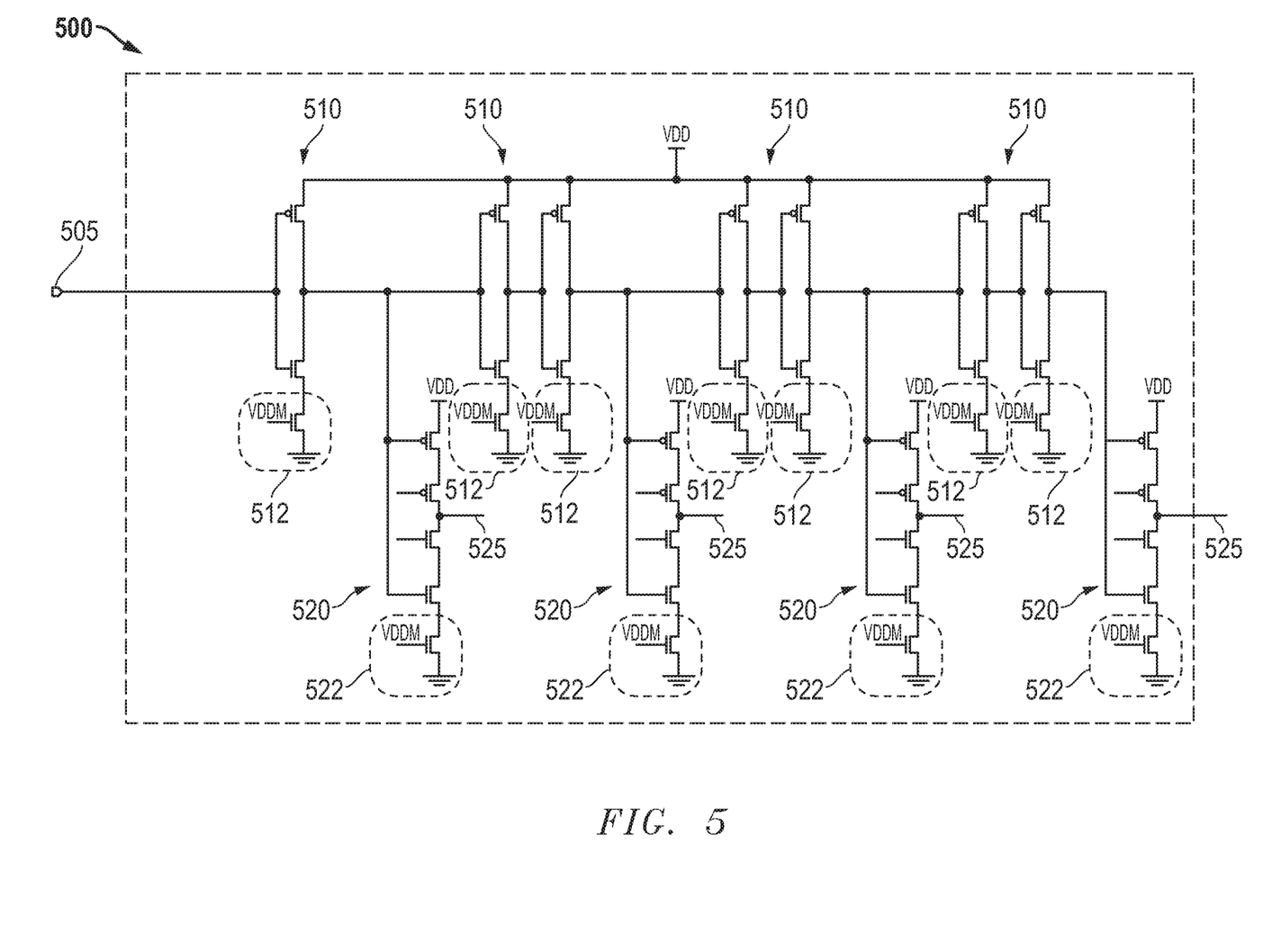
FIG. 5 illustrates in circuit diagram form a dual-rail timer circuit according to some embodiments.

FIG. 5 illustrates in circuit diagram form a timer circuit 500 for operating in a dual-rail circuit according to some embodiments. The depicted timer circuit 500 may be used for the timer circuits 314 of FIG. 3 or the timer circuits 414 of FIG. 4, for example. In this example, a CMOS delay circuit like that of FIG. 1 is the basis of the design, supplied from a first voltage domain. The design is modified to allow the use of second voltage supply VDDM from a second voltage domain to alter the delay. The depicted techniques can also be used with other CMOS delay circuit designs. This particular design is used for illustration purposes.

Timer circuit 500 has an input terminal 505 and includes a number of delay elements 510 connected together in series with input terminal 505. In this example, input terminal 505 is connected to the input of a delay element 510 including one CMOS inverter and an output connected to the input of the next delay element 510. The next delay element and the remaining two delay elements are all constructed with two CMOS inverters, and are all connected in series. Delay elements 510 are supplied with a first supply voltage VDD. Each inverter of delay elements 510 has an NFET (n-channel field effect transistor) footer transistor 512 connecting delay element 510 to a negative supply rail, which may be the ground rail of the first supply voltage (VSS) or a common ground to both voltage domains. In this example, NFET footer transistors 512 connect the source terminal of each CMOS inverter's NMOS transistor to ground. NFET footer transistors 512 remain ON during normal operation, and have a gate voltage proportional to the second supply voltage VDDM applied to their gates. The gate voltage may be equal to the second supply voltage VDDM. This gate voltage alters the allowable current through each inverter and the activation speed of the delay elements, as further discussed below. The second supply voltage VDDM is used to supply a target circuit receiving the output of timer circuit 500. For example, if timer circuit 500 is employed in the memory circuit of FIG. 3, VDDM is the voltage used to supply the memory bitcell array 322.

Timer circuit 500 also includes a number (four in this example) of selectable output branches 520 each connected to a respective delay element 510's output. Each selectable output branch 520 includes an inverter and a three-state selectable output 525. The intermediate transistors in each three-state stack select the programmable output though digital control signals fed to their gates. In operation, the selectable outputs 525 have a voltage that is floating if unselected, or high or low according to the inverter output if selected. This allows all the selectable outputs 525 to be connected to a common output terminal for timer circuit 500. Each selectable output branch 520 is supplied with the first supply voltage VDD. An NFET footer transistor 522 connects each selectable output branch 520 to the negative supply rail. The NFET footer transistors 522 have the second supply voltage applied to their gates.

Figure 6:
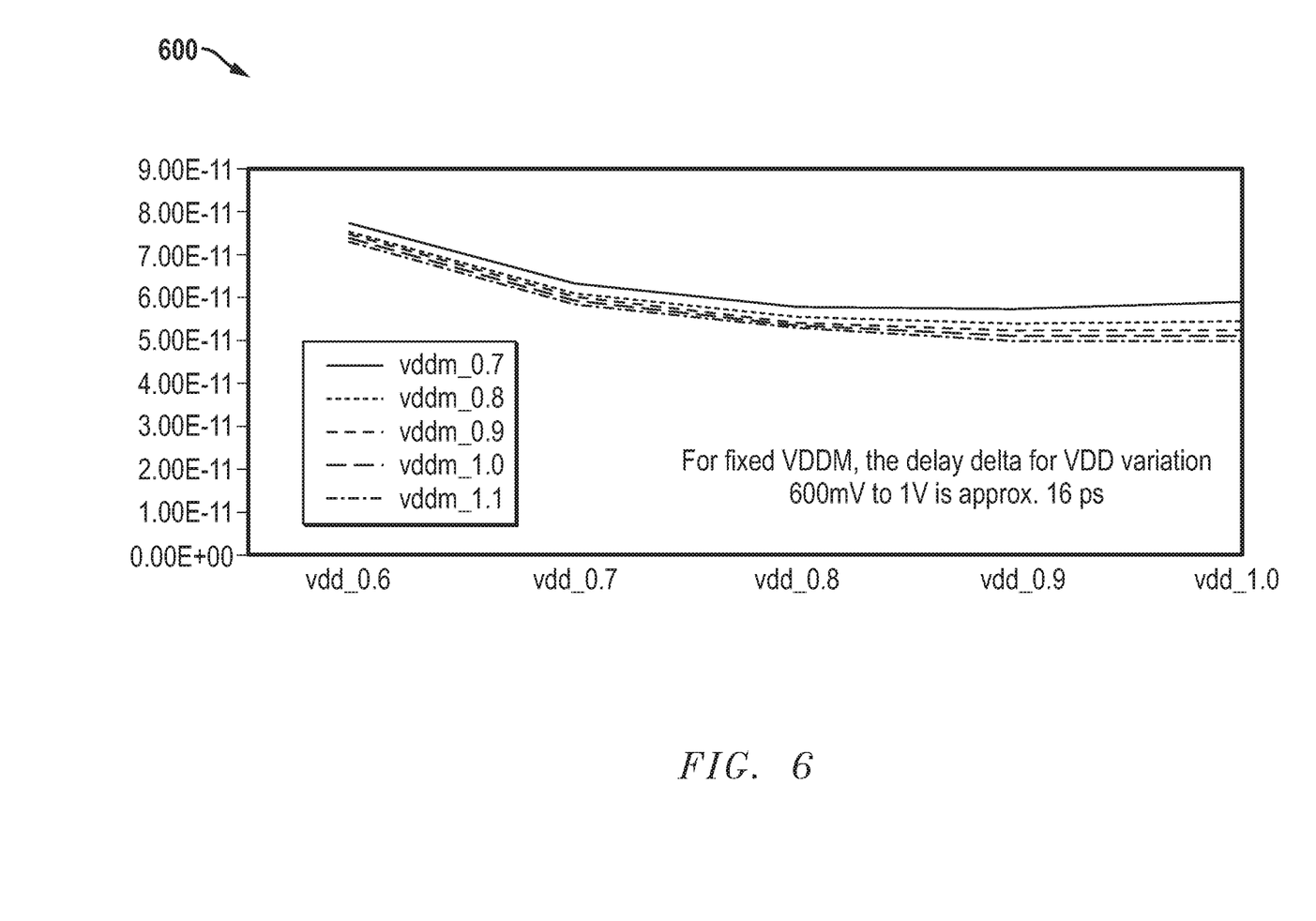
FIG. 6 shows in chart from a set of delay versus voltage variation graphs according to the embodiment of FIG. 5.

The NFET footer transistors 512 and 522 act to allow increased current through the delay elements as the second supply voltage VDDM increases over a specified operating range of the second supply voltage, thereby decreasing the delay of the delay elements. As the second supply voltage VDDM decreases, the opposite effect occurs, and the delay of each delay elements is increased. The resulting behavior is that the NFET footer transistors operate to reduce delay variation of the delay elements as the second supply voltage varies, as seen in FIG. 6. Unlike more complicated delay adjustment circuits, the delay adjustment is achieved without requiring measurement of the VDDM level. The delay adjustment also requires no voltage shifting circuitry, and is achieved without requiring any increase in the design margin allowed for the delay versus that of an unmodified circuit. In fact, the design margin can be reduced. To achieve the effect, the NFET footer transistors 512 and 522 are sized depending on the expected range of variation in VDDM and the current level expected through the delay elements 510 and selectable output branches 520.

FIG. 6 shows in chart from a set of delay versus voltage variation graphs according to the embodiment of FIG. 5. The delay time of timer circuit 500 is on the vertical axis, and the VDD voltage is on the horizontal axis. Graphs are shown for five values of VDDM as shown in the legend. Compared with the behavior of an unmodified timer circuit (FIG. 2), the effect is greatly improved, with variation across the 0.6-1.0V range of VDD of about 16 picoseconds for each depicted value of VDDM.

Figure 7:
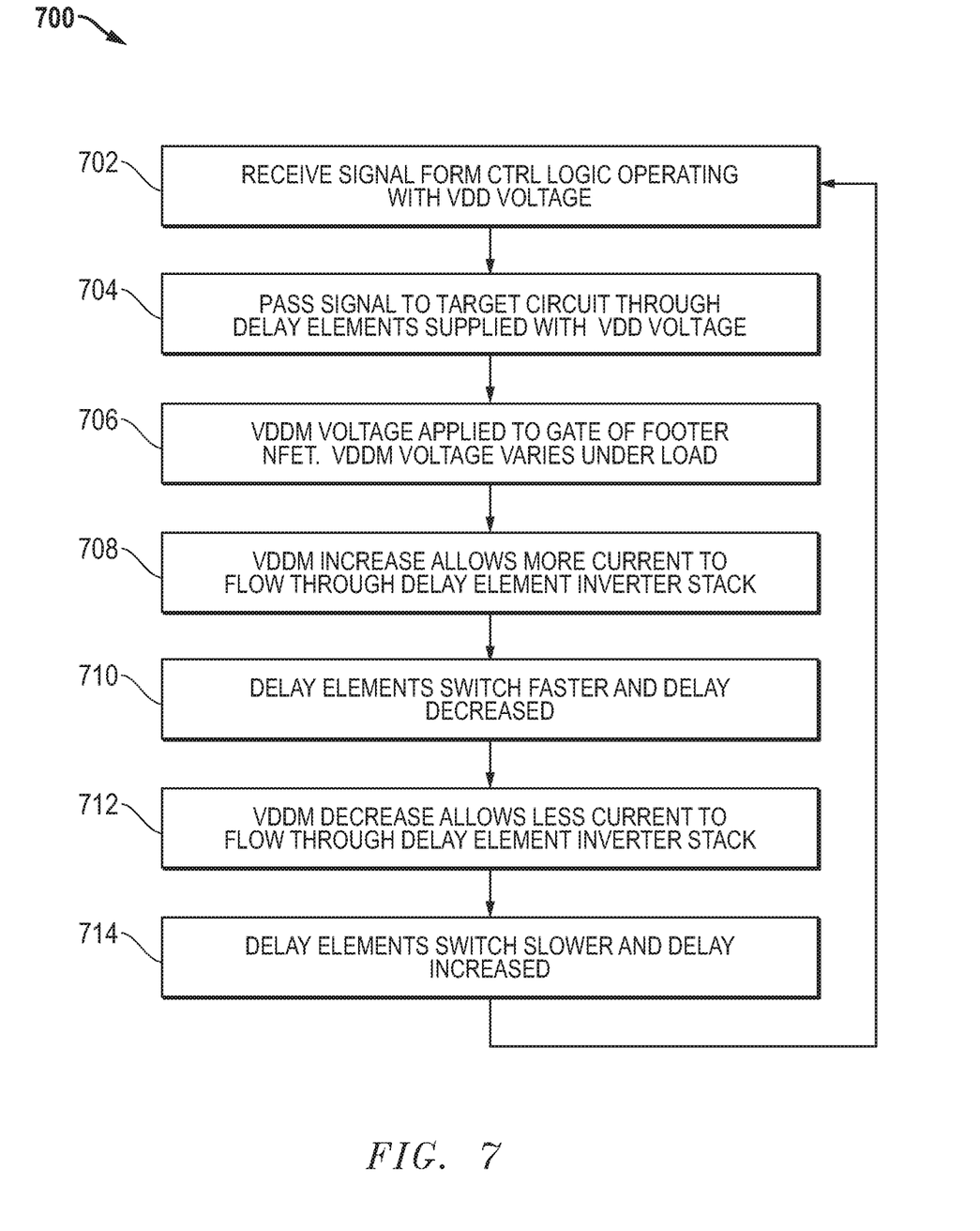
FIG. 7 illustrates in flow diagram form a process of operating a dual rail timer circuit according to some embodiments.

FIG. 7 illustrates in flow diagram form a process 700 of operating a dual rail timer circuit according to some embodiments. Process 700 may be used with the timer circuit of FIG. 5, for example, or other suitable timing circuits with a similar modification applied. Starting at block 702, the timer circuit receives a signal from control logic operating with a first voltage supply VDD. The signal is passed through delay elements supplied with the first voltage supply VDD at block 704. A second supply voltage VDDM is applied to the gate of a footer NFET as shown at block 706. The voltage used may instead be a gate voltage based on the second supply voltage VDDM. This VDDM voltage is allowed to vary under load. For increases in the VDDM voltage, more current is allowed to flow through the delay element inverter stack as shown at block 708. This increase in allowed current causes the delay elements to switch faster, with decreased delay. When VDDM decreases, as shown at block 710, less current is allowed to flow through the delay elements. This decrease in allowed current causes the delay elements to switch slower as shown at block 712, increasing the delay of each element. These steps continue while the circuit operates. Note that while the steps are shown in order, in actual operation signals are constantly passing through the delay elements and the delays experienced vary as VDDM varies.

The systems and circuits of FIG. 3, FIG. 4, and FIG. 5 or any portion thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist comprising a list of gates from a synthesis library. The netlist comprises a set of gates that also represent the functionality of the hardware comprising integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, many known delay element circuits may be modified to include the dual-rail functionality described herein. Different types of delay elements and delay adjustment may be used. Depending on the expected ranges of the second supply voltage compared to the first supply voltage, a linear scaling effect may be applied to the second supply voltage before feeding it to the gates of the NFET footers.

Accordingly, it is intended by the appended claims to cover all modifications of the disclosed embodiments that fall within the scope of the disclosed embodiments.

What is claimed is:

1. A timing circuit comprising:
   an input for receiving a control signal from a logic circuit operating with a first supply voltage;
   an output for supplying the control signal to a circuit operating with a second supply voltage different from the first supply voltage;
   a plurality of delay elements coupled in series between the input and output and supplied with the first supply voltage; and
   one or more NFET footer transistors coupling respective delay elements to a negative supply rail, the one or more NFET footer transistors having a first gate voltage based on the second supply voltage applied to their gates.

2. The timing circuit of claim 1, further comprising a plurality of selectable output branches each connected to a respective delay element output, each selectable output branch supplied with the first supply voltage, and each including an NFET footer transistor coupling the respective output branch to the negative supply rail, the NFET footer transistors having the first gate voltage applied to their gates.

3. The timing circuit of claim 2, wherein each selectable output branch comprises a three state selectable output coupled to the output of the timing circuit.

4. The timing circuit of claim 2, wherein the delay elements and the selectable output branches comprise CMOS (complementary metal oxide semiconductor) transistors.

5. The timing circuit of claim 1, wherein the NFET footer transistors of the delay elements are operable to allow increased current through the delay elements as the second supply voltage increases over a specified operating range of the second supply voltage, thereby decreasing the delay of the delay elements.

6. The timing circuit of claim 5, wherein the NFET footer transistors are operable for reducing delay variation of the delay elements as the second supply voltage varies.

7. The timing circuit of claim 1, wherein the first gate voltage is the second supply voltage.

8. A memory apparatus, comprising:
   a control logic circuit generating timing signals, the control logic circuit supplied with a first supply voltage,
   a plurality of bit cells in an array receiving the timing signals, the bit cells supplied with a second supply voltage different from the first supply voltage; and a timer circuit carrying the timing signals to the bit cells, the timer circuit comprising a plurality of delay elements coupled together in series and supplied with the first supply voltage and each having an NFET (n-channel field effect transistor) footer transistor coupling the delay element to a negative supply rail, the NFET footer transistors having a first gate voltage based on the second supply voltage applied to their gates.

9. The memory apparatus of claim 8, in which the timer circuit further comprises a plurality of selectable output branches each connected to a respective delay element output, each selectable output branch supplied with the first supply voltage, and each including an NFET footer transistor coupling the selectable output branch to a negative supply rail, the NFET footer transistors having the first gate voltage applied to their gates.

10. The memory apparatus of claim 9, wherein each selectable output branch comprises a three state selectable output coupled to an output of the timer circuit.

11. The memory apparatus of claim 8, wherein the NFET footer transistors of the delay elements are operable to allow increased current through the delay elements as the second supply voltage increases over a specified operating range of the second supply voltage, thereby decreasing the delay of the delay elements.

12. The memory apparatus of claim 11, wherein the NFET footer transistors are operable for reducing delay variation of the delay elements as the second supply voltage varies.

13. The memory apparatus of claim 8, wherein each delay element comprises at least one CMOS inverter.

14. A method of delaying signals in a CMOS circuit including a first voltage domain having a first supply voltage and a second voltage domain having a second supply voltage, the method comprising:
    receiving a signal from a logic circuit operating with the first supply voltage;
    passing the signal through a plurality of delay elements each supplied with the first supply voltage;
    applying a first gate voltage based on the second supply voltage to gates of NFET footer transistors of the delay elements, thereby controlling a delay of respective delay elements by varying current allowed through the NFET footer transistors as the second voltage supply varies; and
    passing the signal to a circuit in the second voltage domain.

15. The method of claim 14, wherein controlling the speed of respective delay elements includes reducing delay variation of the delay elements as the second supply voltage varies.

16. The method of claim 14, wherein passing the signal further comprises selecting a respective one of multiple output branches connected to respective delay elements.

17. The method of claim 14, wherein selecting one of the output branches includes activating a three state selectable output of the selected output branch.

18. The method of claim 14, wherein the first gate voltage is the second supply voltage.

19. The method of claim 14, further comprising applying the signal to control an operation of a memory bit cell.

20. The method of claim 19, wherein memory bit cell is a double pump memory cell.

* * * * *

UNITED STATES PATENT AND TRADEMARK OFFICE
CERTIFICATE OF CORRECTION

PATENT NO. : 10,839,875 B2
APPLICATION NO. : 16/370579
DATED : November 17, 2020
INVENTOR(S) : Srinivas R. Sathu et al.

Page 1 of 1

It is certified that error appears in the above-identified patent and that said Letters Patent is hereby corrected as shown below:

On the Title Page

Item (54), please replace "TIMER FOR USE DUAL VOLTAGE SUPPLIES" with --TIMER FOR USE WITH DUAL VOLTAGE SUPPLIES--.

Signed and Sealed this
Twenty-second Day of December, 2020

Andrei Iancu
*Director of the United States Patent and Trademark Office*